US010707070B2

(12) United States Patent
Kang

(10) Patent No.: US 10,707,070 B2
(45) Date of Patent: Jul. 7, 2020

(54) METHODS AND SYSTEMS FOR COATING A SUBSTRATE WITH A FLUID

(71) Applicant: Tokyo Electron Limited, Minato-ku, Tokyo (JP)

(72) Inventor: Hoyoung Kang, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/142,537

(22) Filed: Sep. 26, 2018

(65) Prior Publication Data

US 2019/0103268 A1 Apr. 4, 2019

Related U.S. Application Data

(60) Provisional application No. 62/565,864, filed on Sep. 29, 2017.

(51) Int. Cl.
*H01L 21/02* (2006.01)
*H01L 21/306* (2006.01)
*H01L 21/027* (2006.01)

(52) U.S. Cl.
CPC .... *H01L 21/02057* (2013.01); *H01L 21/0271* (2013.01); *H01L 21/0274* (2013.01); *H01L 21/30604* (2013.01)

(58) Field of Classification Search
None
See application file for complete search history.

(56) References Cited

U.S. PATENT DOCUMENTS

| 4,633,804 | A | * | 1/1987 | Arii | H01L 21/6715 118/501 |
| 6,428,852 | B1 | * | 8/2002 | Pillion | B05D 3/00 118/50 |
| 2008/0146801 | A1 | * | 6/2008 | Kido | C07C 239/10 546/1 |
| 2010/0193994 | A1 | * | 8/2010 | Wuister | B82Y 10/00 264/293 |
| 2014/0330392 | A1 | * | 11/2014 | Schwartz | A61L 27/306 623/23.74 |
| 2015/0123300 | A1 | * | 5/2015 | Tanabe | G03F 7/0002 264/40.1 |
| 2018/0337379 | A1 | * | 11/2018 | Joo | H01M 2/166 |
| 2019/0033711 | A1 | * | 1/2019 | Kang | G03F 7/0002 |

OTHER PUBLICATIONS

Korean Intellectual Property Office, The International Preliminary Report on Patentability for International application No. PCT/US2018/052853, dated Apr. 9, 2020, 7 pg.

* cited by examiner

*Primary Examiner* — Shamim Ahmed

(57) ABSTRACT

Methods and systems for coating a substrate with a fluid are described. In an embodiment, a method may include receiving a substrate in a substrate processing unit, the substrate having one or more physical features formed on a surface of the substrate. The method may include introducing a gas into an environment of the surface of the substrate. Additionally, the method may include applying a fluid to the surface of the substrate, wherein the gas facilitates distribution of the fluid relative to the one or more physical features formed on the surface of the substrate. The method may further include controlling one or more processing parameters related to distribution of the fluid in order to achieve device formation objectives.

20 Claims, 8 Drawing Sheets

METHODS AND SYSTEMS FOR COATING A SUBSTRATE WITH A FLUID

RELATED APPLICATIONS

This application claims priority to U.S. Provisional Patent Application No. 62/565,864, entitled, "METHODS AND SYSTEMS FOR COATING A SUBSTRATE WITH A FLUID," filed Sep. 29, 2017; the disclosure of which is expressly incorporated herein, in its entirety, by reference.

BACKGROUND OF THE INVENTION

Field of Invention

The present invention relates to systems and methods for substrate processing, and more particularly to methods and systems for coating a substrate with a fluid.

Description of Related Art

Semiconductor device processing, including micromechanical, microelectrical, and nanoscale device processing often includes multiple processing steps performed in various processing chamber. Processing steps that including coating a surface of a substrate include washing the surface with water, cleaning solutions, solvents and the like. Additional processing steps may include wet etch processes. Processing steps may also include coating the substrate with layers of organic polymers, such as photoresist. Such steps may include spin-on processes for coating the substrate surface.

Physical features are often formed on the surface of the substrate. The physical features may be formed in one or more layers. Small-scale features may be difficult to completely fill with the fluid material because of the surface tension of the fluid and because of air trapped in recesses formed by the physical features. As the fluid settles into the recesses, the air may compress, but not completely dissolve into the fluid. As a result, the fluid may be prevented from completely filling the recesses formed by the physical features.

SUMMARY OF THE INVENTION

Methods and systems for coating a substrate with a fluid are described. In an embodiment, a method may include receiving a substrate in a substrate processing unit, the substrate having one or more physical features formed on a surface of the substrate. The method may include introducing a gas into an environment of the surface of the substrate. Additionally, the method may include applying a fluid to the surface of the substrate, wherein the gas facilitates distribution of the fluid relative to the one or more physical features formed on the surface of the substrate. The method may further include controlling one or more processing parameters related to distribution of the fluid in order to achieve device formation objectives.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
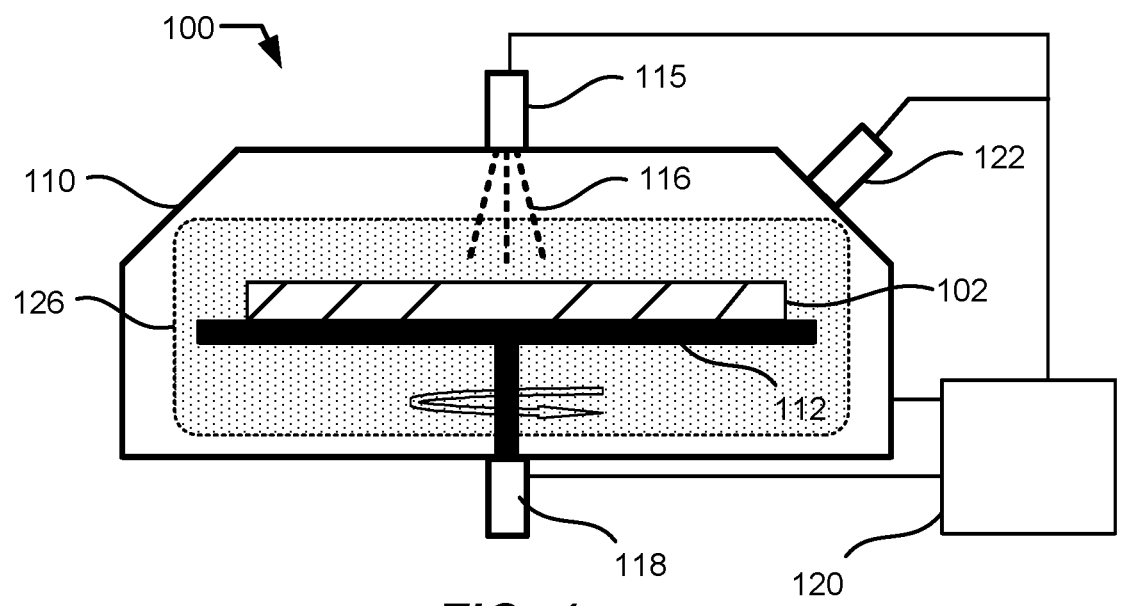
FIG. 1 illustrates one embodiment of a washing tool for semiconductor device processing.

Methods and systems for coating a substrate with a fluid are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

An example of a system 100 for substrate washing is illustrated in FIG. 1. In such an embodiment, the system 100 includes a wash chamber 110 to contain the wash fluid 116, which may include water, cleansers, weak acids, or other wash solutions or mixtures. Examples of wash fluids 116 may include hot or cold deionized water, solvents, etc.

In an embodiment, the substrate 102 is placed within the wash chamber 110 on a rotating substrate holder 112, such as a plate or chuck. The rotating substrate holder 112 may be rotated at various rates of rotation by a motorized base 118. In an embodiment, the motorized base 118 may be controlled by a wash controller 120. Additionally, the wash controller 120 may control a rate at which cleansing fluid dispenser 115, such as a nozzle or showerhead, may dispense the wash fluid 116, such as deionized water. The wash fluid may be drawn across a surface of the substrate 102 by centrifugal force, thereby removing particles of material from the substrate surface. The wash rate can be controlled by the wash controller 120, by adjusting the rate of rotation, the rate of dispensing, or both.

In an embodiment, the wash chamber 110 may be filled with a gas 126 to facilitate the wash process. The gas 126 may be injected into the wash chamber 110 by a gas injection system 122, which may include a nozzle, a flow regulator, gas lines, a gas source, etc. One of ordinary skill will recognize a variety of suitable gas injection systems. In an embodiment, the flow rate of the gas injection system 122 may be controlled by the wash controller 120. In various embodiments, the gas 126 may be selected to facilitate coating of the surface of the substrate 102 with the wash fluid 116. For example, if the wash fluid 116 is water, then the gas 126 may include water vapor.

In another embodiment, if the wash fluid 116 is water, then the gas 126 may be selected to create polar entities on the surface of the substrate 102 to render the surface hydrophilic. Examples of such gases may include oxygen, which may create carbonyl, carboxyl, ester, ether, hydroxyl, and hydroperoxyl groups, etc. Nitrogen may also create amino groups causing a polymer surface, such as photoresist to become hydrophilic. Ammonia may create amino groups of varying composition and densities. Free radicals produced by argon may also draw the wash fluid into the recesses formed by physical features on the surface of the substrate.

In another embodiment, a gas is selected from a group of solvent gases such as $C_xH_y$, $C_xH_yF_z$, $C_xH_yCl_z$, $C_xF_yCl_z$, where x, y, and z are integers may also be used in the wash chamber 110, where such gases may more readily absorb into certain selected wash fluid 116.

Figure 2:
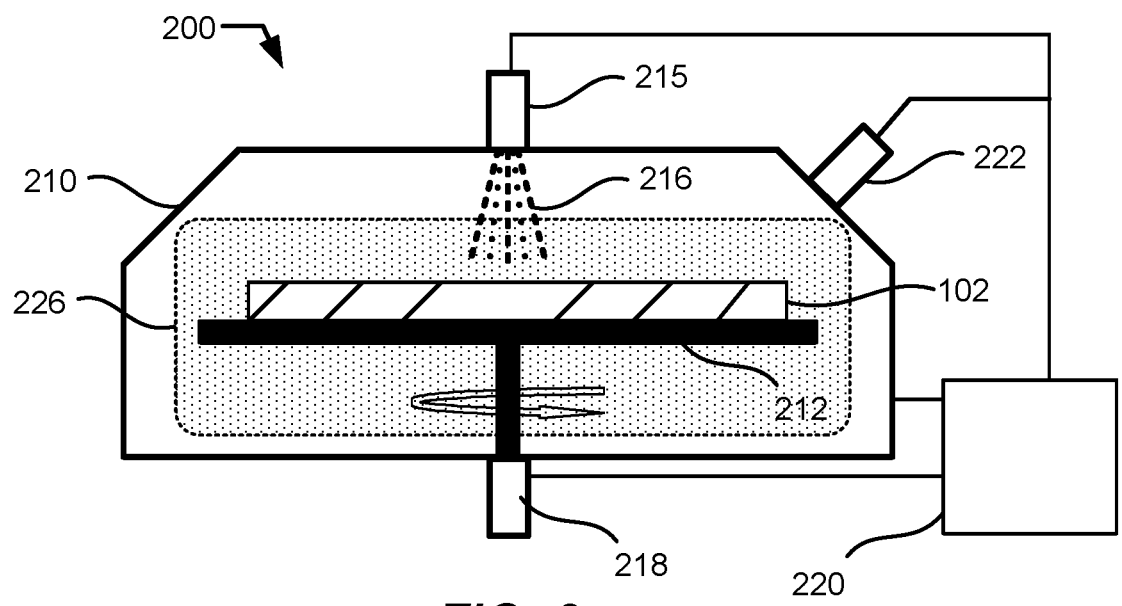
FIG. 2 illustrates one embodiment of a wet etch tool for semiconductor device processing.

Additional embodiments of processing chambers may utilize fluid coatings during device processing, including for example, a wet etch system. An example of a system 200 for wet etch is illustrated in FIG. 2. In such an embodiment, the system 200 includes a wet etch chamber 210 to contain the wet etch chemicals, which may include harsh acids in some embodiments. Examples of wet etch acids may include a weak hydrofluoric acid (HF) dilution (e.g., HF/HCl), or other less aggressive etch recipes known to those of skill in the art.

In an embodiment, the substrate 102 is placed within the chamber 210 on a rotating substrate holder 212, such as a plate or chuck. The rotating substrate holder 212 may be rotated at various rates of rotation by a motorized base 218. In an embodiment, the motorized base 218 may be controlled by a controller 220. Additionally, the etch controller 220 may control a rate at which an etch solution dispenser 215, such as a nozzle or showerhead, may dispense an etch fluid 216, such as the HF dilution. The etch solution may be drawn across a surface of the substrate 102 by centrifugal force, thereby removing particles of material from the substrate surface. The etch rate can be controlled by the etch controller 220, by adjusting the rate of rotation, the rate of dispensing, or both.

Similarly, a gas 226 may be introduced into the wet etch chamber 210 by a gas injection system 222. The gas injection system 222 may be substantially similar to the gas injection system 122 described in FIG. 1, but may be configured to inject gases specific for wet etch chemistries. The gas injection system 222 may be coupled to and controlled by the etch controller 220. In various embodiments, the gas 226 may be selected according to the wet etch chemistry selected, and may facilitate coverage of the surface of the substrate 102 with the etch fluid 216. For example, the gas 226 may be gaseous hydrogen fluoride (HF) in embodiments where the etch fluid is an HF dilution. One of ordinary skill will recognize various other combinations of gas 226 and etch fluids 216 which may be beneficial.

Figure 3:
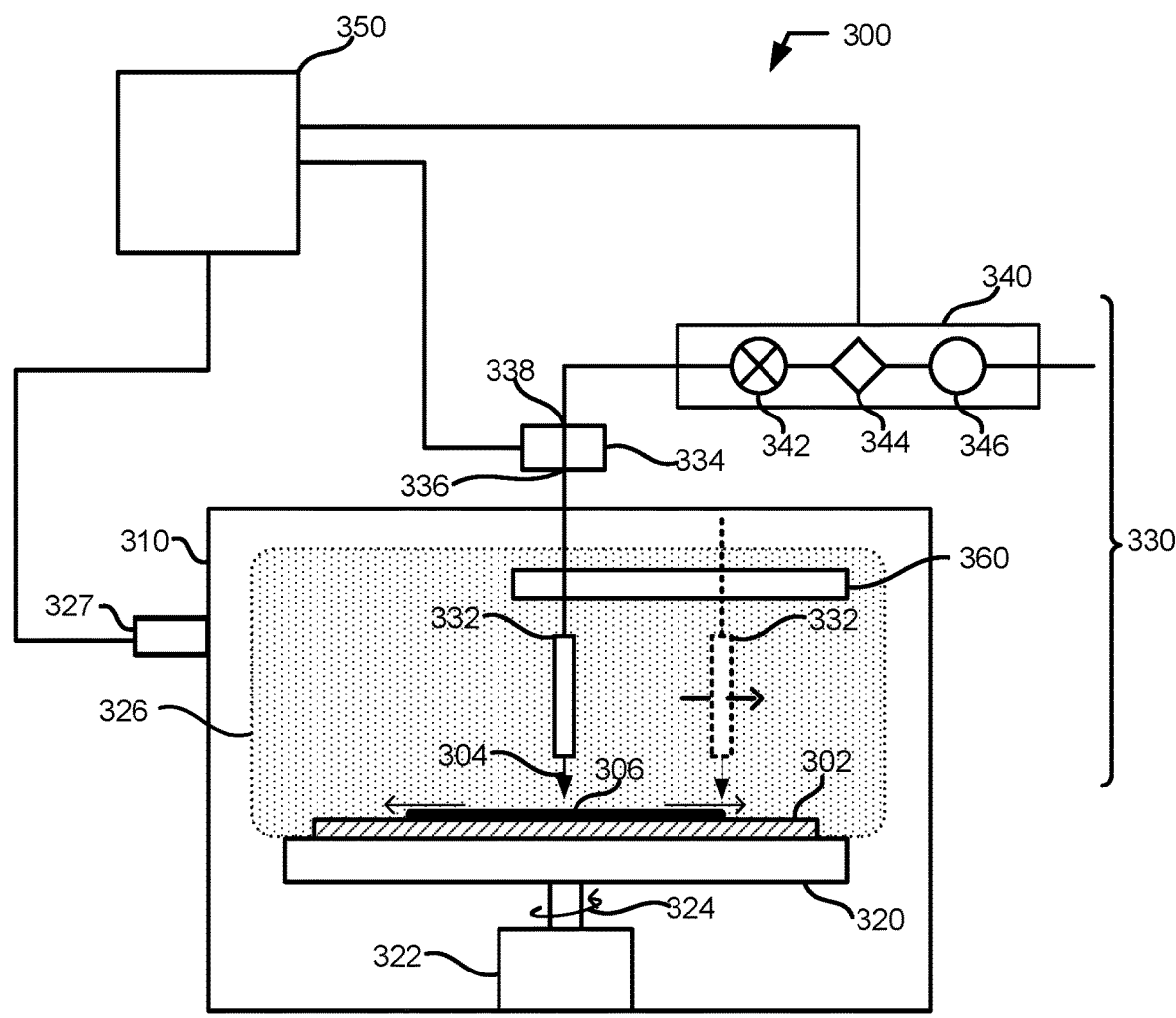
FIG. 3 illustrates one embodiment of a spin-on coating tool for semiconductor device processing.

FIG. 3 illustrates a coating system 300 including a coating chamber 310, a substrate holder 320 coupled to the coating chamber 310 and configured to support substrate 302, and a solution nozzle assembly 330 configured to dispense a coating fluid 304, such as an organic solution. An embodiment of an organic solution is a photoresist material. Additionally, the coating system 300 includes a coating controller 350 coupled to the substrate holder 320 and the solution nozzle assembly 330, and configured to exchange data, information, and control signals with the substrate holder 320 and the solution nozzle assembly 330.

The substrate holder 320 is configured to rotate (or spin) substrate 302 during dispensing of coating fluid 304 on the upper surface of substrate 302 from the solution nozzle assembly 330. A drive unit 322 coupled to the substrate holder 320 is configured to rotate the substrate holder 320 causing the coating fluid 304 to form a coating on the surface of the substrate 302. The drive unit 322 can, for example, permit setting the rotation rate, and the rate of acceleration of the substrate holder rotation 324.

The solution nozzle assembly 330 includes a single nozzle positioned substantially near the center of substrate 302, and above an upper surface thereof. The nozzle 332 is configured to dispense a solution, such as a trilayer photoresist film solution including, for example an Organic Planarization Layer (OPL), a Silicon-containing Anti-Reflective Coating (SiARC), and a photosensitive patternable photoresist layer, on an upper surface of substrate 302 in a direction substantially perpendicular to the upper surface of substrate 302. The nozzle 332 is coupled to an outlet end 336 of a control valve 334. An inlet end 338 of control valve 334 is coupled to a solution supply system 340. The control valve 334 can be configured to regulate dispensing the solution on substrate 302. When open, the solution is dispensed upon the substrate 302. When closed, the solution is not dispensed upon the substrate 302. The solution supply system 340 can include at least one of a fluid supply valve 342, a filter 344, and a flow measurement/control device 346. Additionally, nozzle 332 is configured to translate in a radial direction from the center of substrate 302 to the peripheral edge of substrate 302 using translation drive assembly 360, while dispensing solution as shown by the ghost image of nozzle 332.

Additionally, controller 350 includes a microprocessor, memory, and a digital I/O port (potentially including D/A and/or ND converters) capable of generating control voltages sufficient to communicate and activate inputs to the drive unit 322 of substrate holder 320, the solution nozzle assembly 330 (e.g., control valve 334), solution supply system 340, and translation drive assembly 360 as well as monitor outputs from these systems. A program stored in the memory is utilized to interact with these systems according to a stored process recipe.

Controller 350 may be locally located relative to coating system 300, or it may be remotely located relative to the coating system 300 via an internet or intranet. Thus, controller 350 can exchange data with coating system 300 using at least one of a direct connection, an intranet, and the internet. Controller 350 may be coupled to an intranet at a customer site (i.e., a device maker, etc.), or coupled to an intranet at a vendor site (i.e., an equipment manufacturer). Furthermore, another computer (i.e., controller, server, etc.) can access controller 350 to exchange data via at least one of a direct connection, an intranet, and the internet.

In an embodiment, gas 326 may be introduced into the coating chamber 310 via a gas injection system 327. The gas may include solvent gases, which may dissolve into the coating more readily than air. In an embodiment, solvent gases such as $C_xH_y$, $C_xH_yF_z$, $C_xH_yCl_z$, $C_xF_yCl_z$, where x, y, and z are integers may be used. One of ordinary skill will recognize a variety of gases which may be used in combination with selected coating materials.

In the various embodiments described, certain gases introduced into the systems of FIGS. 1-3 may be flammable. In such embodiments, the systems of FIG. 1 may include certain fire or explosion prevention mechanisms, including flame or spark arrestors, particularly near the motors and drive units. Additionally, the systems of FIGS. 1-3 may include fire mitigation mechanisms, including the ability to inject $CO_2$ or other fire mitigating gases into the chambers 110, 210, and 310.

Figure 4A:
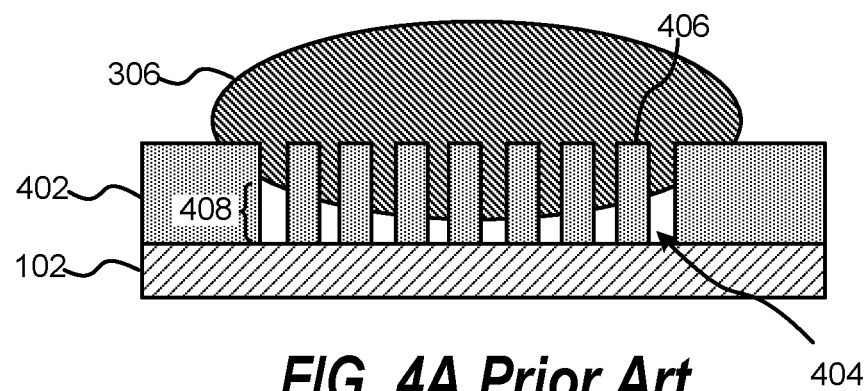
FIG. 4A illustrates one embodiment of a prior art process for coating a substrate with a fluid.
Figure 4B:
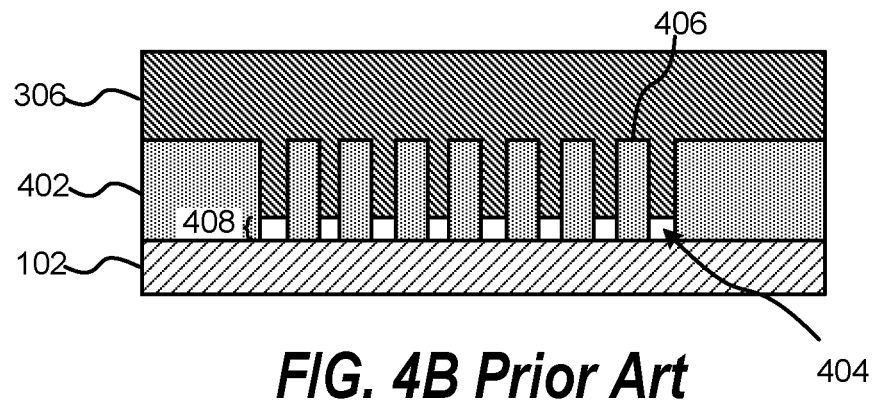
FIG. 4B illustrates one embodiment of a prior art process for coating a substrate with a fluid.

FIG. 4A illustrates one embodiment of a process for coating a substrate with a fluid. In the process of FIG. 4A, a fluid, such as photoresist 306 is applied to a surface of the substrate 102. The substrate 102 may include a patterned layer 402 having one or more physical features 406 formed therein. Gaps 408 may be formed between the photoresist 306 and the substrate 102 in recesses between the physical features 406. In the process of FIG. 4A, air 404 may fill the gaps 408. As the photoresist 306 settles into the recesses, as shown in FIG. 4B, the gaps 408 may be reduced in size. As the gaps 408 are reduced, the air 404 may be compressed. The compressed air 404 in the gaps 408 may prevent the photoresist 306 from completely filling the recesses formed between the physical features 406.

Figure 5A:
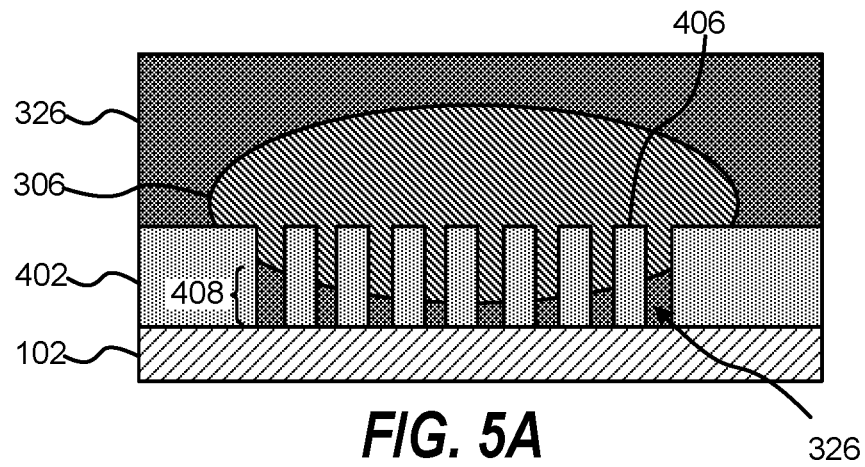
FIG. 5A illustrates one embodiment of a process for coating a substrate with a fluid.
Figure 5B:
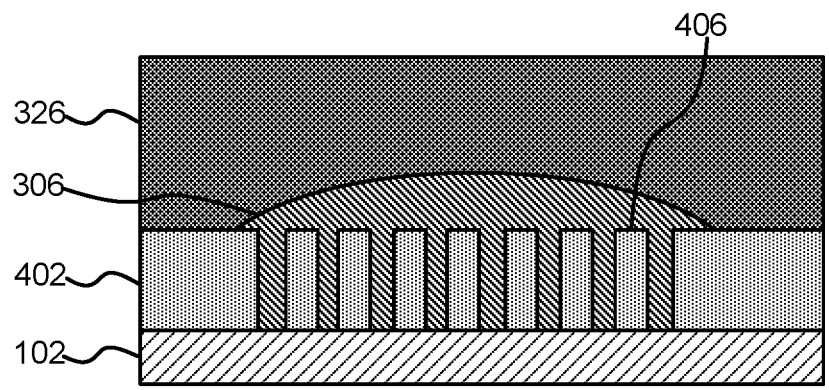
FIG. 5B illustrates one embodiment of a process for coating a substrate with a fluid.
Figure 5C:
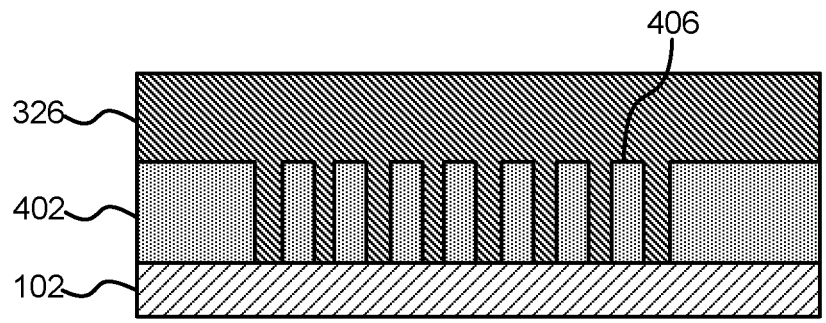
FIG. 5C illustrates one embodiment of a process for coating a substrate with a fluid.

In the embodiments described in FIGS. 5A-5C, a gas 326 may be introduced to the surface of the substrate 102. In one embodiment, the gas 326 may be a solvent for the fluid. In the example of FIG. 3, the fluid may be a photoresist. Photoresist materials from FIG. 3 are used in FIGS. 5A-5C for illustrative purposes, but one of ordinary skill will recognize that similar embodiments relating to the systems of FIGS. 1 and 2 also exist. Indeed, one of ordinary skill will recognize a variety of systems and examples to which the embodiments of FIGS. 5A-5C apply, outside of the embodiments of FIGS. 1-3. As shown in FIG. 5A, the gas 326 may be injected or dispensed in a region near the surface of the substrate 102, including in the recesses formed by physical features 406 formed in the patterned layer 402. The fluid, in this example photoresist 306, may be dispensed on the substrate 102. Gaps 408 between the fluid and the substrate 102 may form in the recesses formed by the physical features 406, trapping gas 326 therein.

In an embodiment, the gas 326 is selected to dissolve into the fluid more readily than air. As a result, the fluid disperses into the recesses filling the gaps 408, thus removing the gaps 408 as shown in FIG. 5B. As shown in FIG. 5C, the process yields a device having even coverage of the fluid in the recesses of the patterned layer 402 formed by physical features 406 therein.

In other embodiments, the gas does not absorb into the fluid, but rather causes the surface to become hydrophilic drawing the fluid into the recesses formed by the physical features 406. Other fluid dynamics principles may be leveraged to enhance coverage of the surface of the substrate with a coating of fluid using a selected gas to enhance the coating process. Such embodiments may improve device formation objectives, as compared with the process described in FIGS. 4A-4B. Examples of device formation objectives include uniformity of height and profile of features on the surface of the substrate.

Figure 6:
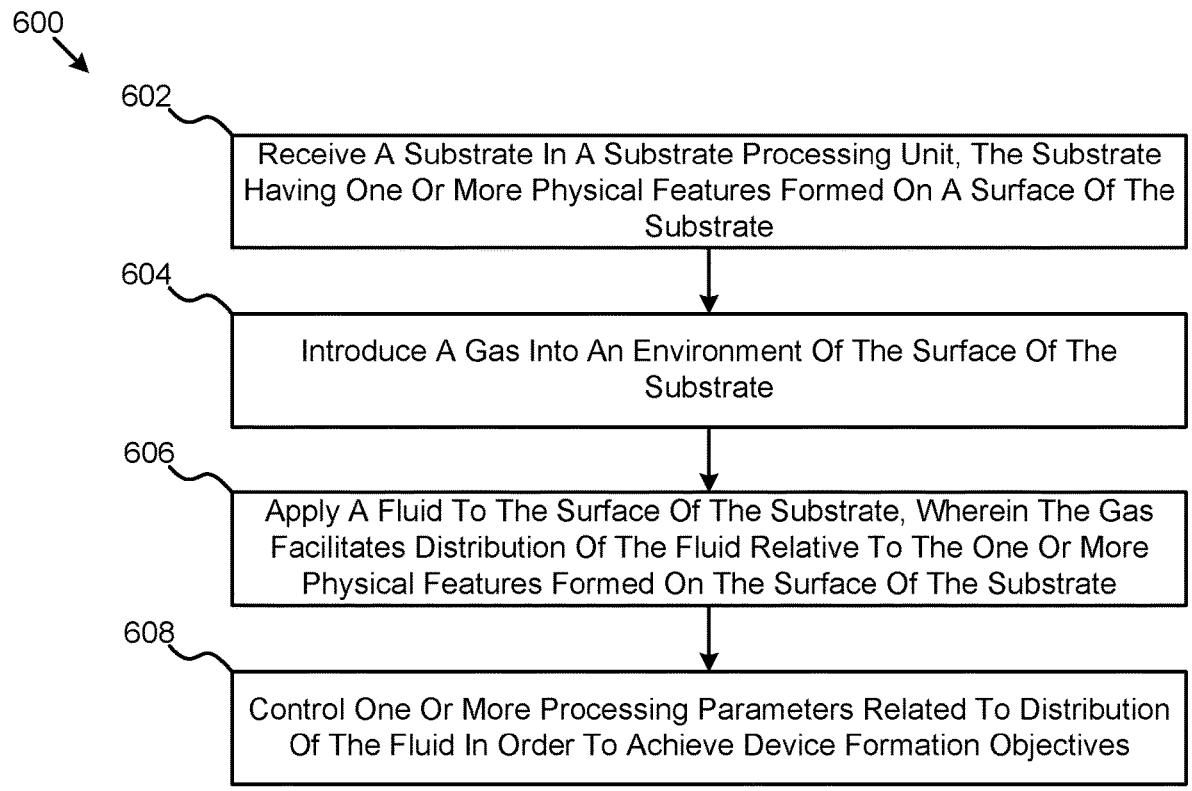
FIG. 6 illustrates one embodiment of a method for coating a substrate with a fluid.

FIG. 6 illustrates one embodiment of a method 600 for coating a substrate with a fluid. In an embodiment, the method 600 may include receiving a substrate in a substrate processing unit, the substrate having one or more physical features formed on a surface of the substrate, as shown at block 602. The method 600 may include introducing a gas into an environment of the surface of the substrate at block 604. Additionally, at block 606, the method 600 may include applying a fluid to the surface of the substrate, wherein the gas facilitates distribution of the fluid relative to the one or more physical features formed on the surface of the substrate. The method 600 may further include controlling one or more processing parameters related to distribution of the fluid in order to achieve device formation objectives, as shown at block 608.

Another embodiment includes a method of depositing liquid on a substrate. The method includes receiving a substrate in a substrate processing unit, such as a coater-developer module, cleaning module, or etch chamber. The substrate has one or more physical features formed on a surface of the substrate. For example, these features can be trenches, holes, fins, nanosheets, or other topography from microfabrication of semiconductor substrates.

A first gas is identified that is dissolvable into a first fluid. Thus, the first fluid and first gas are compatible in that the first gas can be readily absorbed into the first fluid. The first gas is introduced into an environment of the surface of the substrate so that the first gas fills spaces between the physical features formed on the substrate. In other words, the first gas displaces initial or atmospheric gas that was surrounding the physical features. This can be executed by purging an entire chamber with the first gas, or directing the first gas (a stream of the first gas) to the substrate surface such as during or immediately prior to deposition of the first fluid. The first gas can be, for example, a solvent of a particular photoresist or etchant to be used.

The first fluid is deposited onto the surface of the substrate such that the first gas dissolves into the first fluid resulting in the first fluid filling the spaces between the physical features formed on the substrate without gas remaining in the spaces between the physical features formed on the substrate. Accordingly, supplying a dissolvable/absorbable gas to a substrate prior to depositing a fluid herein provides a substrate pre-wetting technique that enables the fluid to quickly fill all spaces occupied by the gas without atmospheric or non-dissolvable gas preventing complete "wetting" of the spaces between the structures, and thereby preventing complete filling of the spaces. In other words, air pockets or air gaps do not remain because the fluid can quickly enter/fill spaces by absorbing the gas in the spaces.

In some embodiments, the selected gas can dissolve into (be absorbed by) a deposited fluid essentially immediately or in less than a few seconds. The selected gas at least dissolves into the deposited fluid faster than air (atmospheric) would dissolve into the fluid. Accordingly, a given substrate topography can be quickly filled by a given liquid, which increases throughput, reduces processing times, improves cleaning/etch efficiency, and reduces defects in deposited films such as photoresist films.

Figure 7:
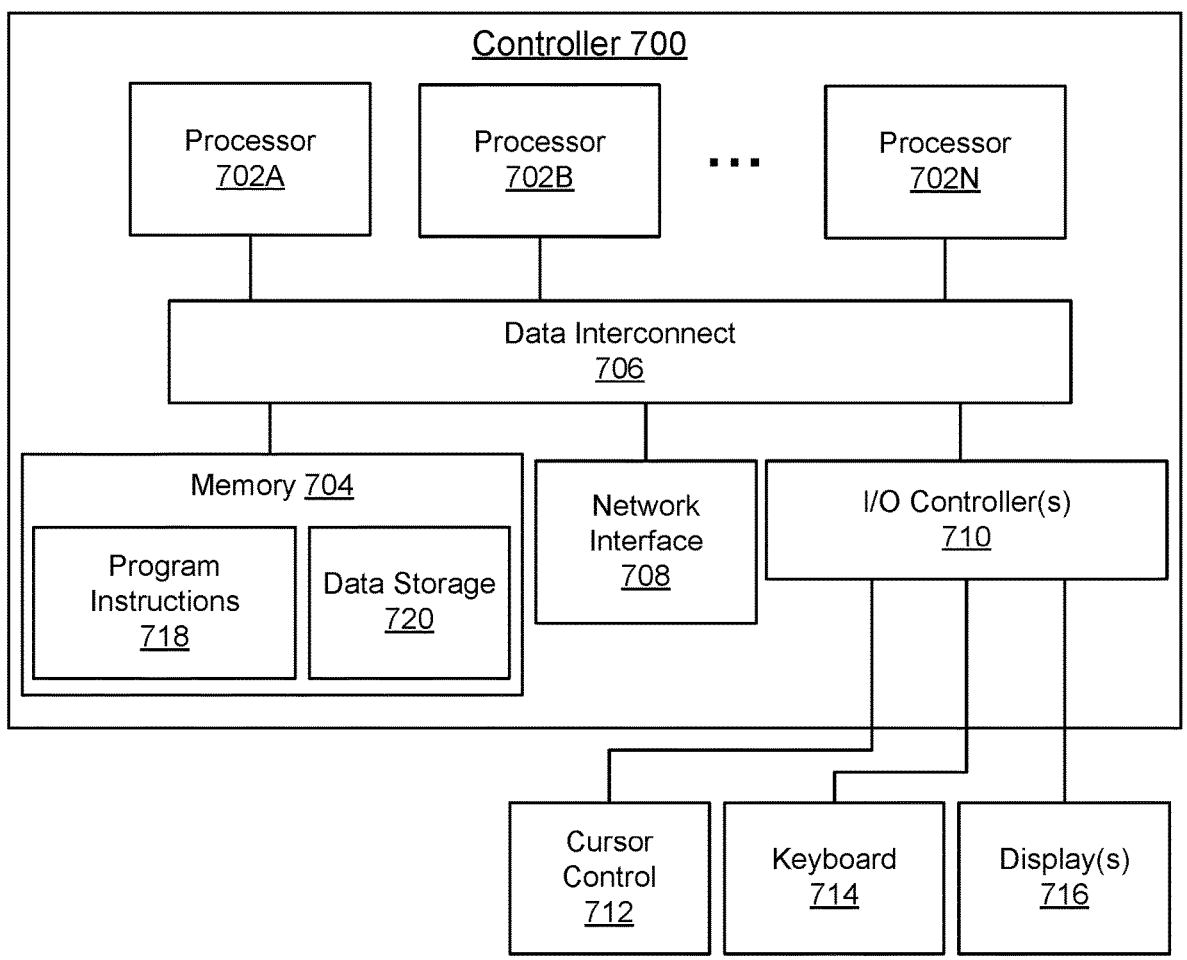
FIG. 7 illustrates one embodiment of a controller for controlling a process for coating a substrate with a fluid.

FIG. 7 is a schematic block diagram illustrating one embodiment of a controller 700 configurable for coating a substrate with a fluid. In one embodiment, the wash controller 120 may be implemented on a computer system similar to the controller 700 described in FIG. 7. Similarly, the wet etch controller 220 may be implemented on a computer system similar to the controller 700 described in FIG. 7. The coating controller 350 may also be implemented on a computer system similar to the controller 700. In various embodiments, controller 700 may be a microcontroller, Programmable Logic Chip (PLC), computer workstation, laptop, or the like.

As illustrated, controller 700 includes one or more processors 702A-N coupled to a system memory 704 via data interconnect 706. Controller 700 further includes network interface 708 coupled to data interconnect 706, and input/output (I/O) controller(s) 710, coupled to devices such as cursor control device 712, keyboard 714, and display(s) 716. In some embodiments, a given entity may be implemented using a single instance of controller 700, while in other embodiments multiple such systems, or multiple nodes making up controller 700, may be configured to host different portions or instances of embodiments.

In various embodiments, controller 700 may be a single-processor system including one processor 702A, or a multi-processor system including two or more processors 702A-N (e.g., two, four, eight, or another suitable number). Processor(s) 702A-N may be any processor capable of executing program instructions. For example, in various embodiments, processor(s) 702A-N may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of processor(s) 702A-N may commonly, but not necessarily, implement the same ISA. Also, in some embodiments, at least one processor(s) 702A-N may be a graphics processing unit (GPU) or other dedicated graphics-rendering device.

System memory 704 may be configured to store program instructions and/or data accessible by processor(s) 702A-N. For example, system memory 704 may be used to store software program and/or database shown in FIG. 6. In various embodiments, system memory 704 may be implemented using any suitable memory technology, such as static random access memory (SRAM), synchronous dynamic RAM (SDRAM), nonvolatile/Flash-type memory, or any other type of memory. As illustrated, program instructions and data implementing certain operations, such as, for example, those described above, may be stored within system memory 704 as program instructions 718 and data storage 720, respectively. In other embodiments, program instructions and/or data may be received, sent or stored upon different types of computer-accessible media or on similar media separate from system memory 704 or controller 700. Generally speaking, a computer-accessible medium may include any tangible, non-transitory storage media or memory media such as electronic, magnetic, or optical media—e.g., disk or CD/DVD-ROM coupled to controller 700 via data interconnect 706, or non-volatile memory storage (e.g., "flash" memory).

In an embodiment, data interconnect 706 may be configured to coordinate I/O traffic between processors 702A-N, system memory 704, and any peripheral devices including network interface 708 or other peripheral interfaces, connected via I/O controller(s) 710. In some embodiments, data interconnect 706 may perform any necessary protocol, timing or other data transformations to convert data signals from one component (e.g., system memory 704) into a format suitable for use by another component (e.g., processor(s) 702A-N). In some embodiments, data interconnect 706 may include support for devices attached through various types of peripheral buses, such as a variant of the Peripheral Component Interconnect (PCI) bus standard or the Universal Serial Bus (USB) standard, for example. In some embodiments, the operations of data interconnect 706 may be split into two or more separate components, such as a north bridge and a south bridge, for example. In addition, in some embodiments some or all of the operations of data interconnect 706, such as an interface to system memory 704, may be incorporated directly into processor(s) 702A-N.

Network interface 708 may be configured to allow data to be exchanged between controller 700 and other devices, such as other computer systems attached to controller 700. In various embodiments, network interface 708 may support communication via wired or wireless general data networks, such as any suitable type of Ethernet network, for example; via telecommunications/telephony networks such as analog voice networks or digital fiber communications networks; via storage area networks such as Fiber Channel SANs, or via any other suitable type of network and/or protocol.

I/O controller(s) 710 may, in some embodiments, enable connection to one or more display terminals, keyboards, keypads, touch screens, scanning devices, voice or optical recognition devices, or any other devices suitable for entering or retrieving data by one or more computer systems. Multiple input/output devices may be present in controller 700 or may be distributed on various nodes of controller 700. In some embodiments, similar I/O devices may be separate from controller 700 and may interact with controller 700 through a wired or wireless connection, such as over network interface 708.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

As shown in FIG. 7, system memory 704 may include program instructions 718, configured to implement certain embodiments described herein, and data storage 720, comprising various data accessible by program instructions 718. In an embodiment, program instructions 718 may include software elements. For example, program instructions 718 may be implemented in various embodiments using any desired programming language, scripting language, or combination of programming languages and/or scripting languages. Data storage 720 may include data that may be used in these embodiments such as, for example, settings for formation objectives. In other embodiments, other or different software elements and data may be included.

A person of ordinary skill in the art will appreciate that controller 700 is merely illustrative and is not intended to limit the scope of the disclosure described herein. In particular, the computer system and devices may include any combination of hardware or software that can perform the indicated operations. In addition, the operations performed by the illustrated components may, in some embodiments, be performed by fewer components or distributed across additional components. Similarly, in other embodiments, the operations of some of the illustrated components may not be performed and/or other additional operations may be available. Accordingly, systems and methods described herein may be implemented or executed with other computer system configurations.

The controller 700 described herein may be programmed according to the embodiments of FIG. 6 to further control device formation objectives, including uniformity of height and profile of features on the surface of the substrate. The controller 700 may control device formation objective may controlling the gas selection, gas concentration in the chambers 110, 210, 310, gas pressure, gas temperature, fluid flow rate, substrate spin rate, etc.

Figure 8:
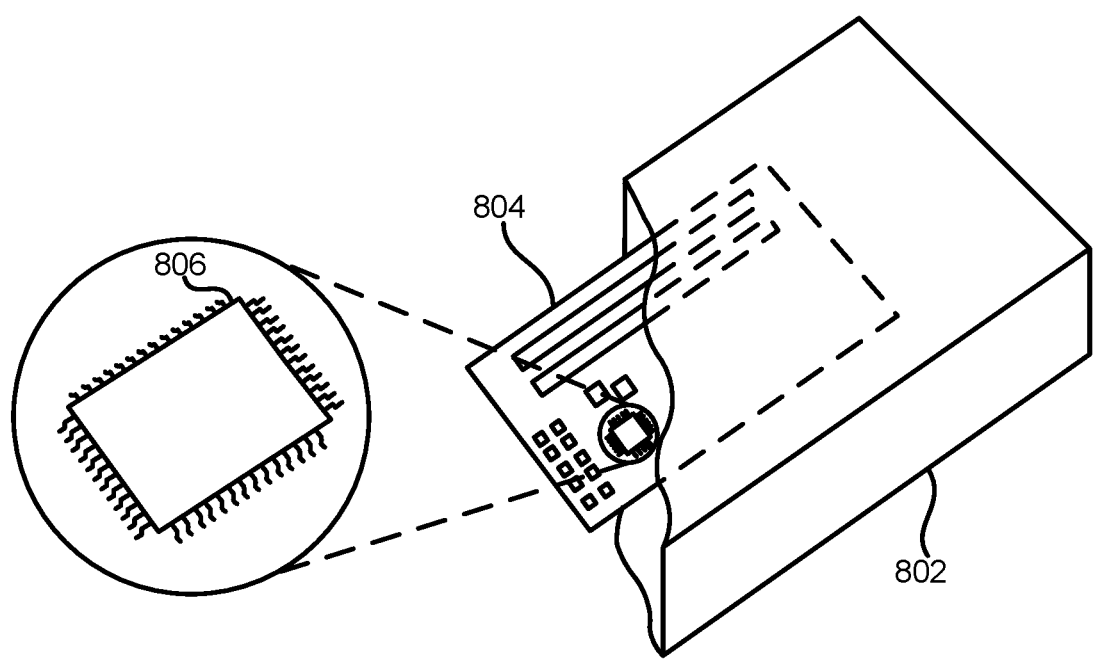
FIG. 8 illustrates one embodiment of a system comprising a device formed by a method for coating a substrate with a fluid.

The embodiments of the processes and methods described herein may be used in commercial processes for manufacturing semiconductor-based products for inclusion in commercial products. For example, FIG. 8 illustrates an electrical device 802 comprising a printed circuit board (PCB). The electrical device 802 may be one of a number of commercially available products, including for example, computers, computer monitors, televisions, audio amplifiers, cameras, smartphones and personal data assistants, tablet computing devices, smart watches, application-specific processing equipment, sensor devices, medical devices, etc.

One of ordinary skill will recognize that devices manufactured according to the present embodiments are not limited to any particular field.

The electrical device 802 may include one or more PCBs 804, the PCBs 804 comprising one or more semiconductor-based electrical components, such as chip package 806. Chip package 806 may include a segmented chip of a wafer having one or more features, such as semiconductor devices described in FIGS. 5A-5C disposed thereon. The chip may comprise, for example, a substrate 102. The chip may be packaged in a durable package for protection of the features disposed thereon. The chip package 806 may further include one or more contact pins configured to provide external access to certain contact points on the chip.

Advantageously, the size and density of the physical features 406 disposed on the chip in chip package 806 may be small relative to devices manufactured with other techniques, because use of the high gap fill spin coating process used in processing of the device. Further, the described methods allow for easy cleaning and wet etching of the device during processing, relative to previous removal methods.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method comprising:
   receiving a substrate in a substrate processing unit, the substrate processing unit configured to process semiconductor devices, the substrate having one or more physical features formed on a surface of the substrate, the one or more physical features defining recesses between the one or more physical features;
   introducing a first gas into an environment of the surface of the substrate, the first gas being dissolvable into a first fluid;
   applying the first fluid to the surface of the substrate subsequent to introducing the first gas into the environment of the surface of the substrate;
   spinning the first fluid over the surface of the substrate, wherein the first gas facilitates distribution of the first fluid into the recesses defined by the one or more physical features formed on the surface of the substrate by action of the first gas dissolving into the first fluid; and
   controlling one or more processing parameters related to distribution of the first fluid in order to achieve device formation objectives.

2. The method of claim 1, wherein the first gas is organic, and wherein the first fluid is an organic material.

3. The method of claim 2, wherein the first gas is selected from the group consisting of $C_xH_y$, $C_xH_yF_z$, $C_xH_yCl_z$, and $C_xF_yCl_z$, where x, y, and z are integers.

4. The method of claim 1, wherein the substrate processing unit is a coater-developer module configured for depositing films on surfaces of substrates.

5. The method of claim 4, wherein the first fluid is selected from the group consisting of photoresist, organic planarization layer, and silicon-containing anti-reflective coating.

6. The method of claim 1, wherein the substrate processing unit is a cleaning module configured to clean the surface of the substrate.

7. The method of claim 6, wherein the first fluid comprises water.

8. The method of claim 6, wherein the first fluid is a cleaning solution.

9. The method of claim 6, wherein the first gas is hydrophilic.

10. The method of claim 1, wherein the substrate processing unit is a wet etch chamber configured to etch materials on the substrate using wet etch chemicals.

11. The method of claim 10, wherein the first fluid comprises the wet etch chemicals.

12. The method of claim 1, further comprising injecting the first gas into a chamber of the substrate processing unit.

13. The method of claim 1, further comprising injecting the first gas along the surface of the substrate.

14. The method of claim 1, wherein the first gas comprises the first fluid in gaseous form.

15. The method of claim 1, wherein controlling the one or more processing parameters includes controlling a gas concentration at the surface of the substrate.

16. The method of claim 1, wherein controlling the one or more processing parameters includes controlling a gas pressure within a chamber of the substrate processing unit.

17. The method of claim 1, wherein the device formation objectives include uniformity of height and profile of features on the surface of the substrate.

18. A method comprising:
receiving a substrate in a substrate processing unit, the substrate processing unit configured to process semiconductor devices, the substrate having one or more physical features formed on a surface of the substrate;
identifying a first gas that is dissolvable into a first fluid;
introducing the first gas into an environment of the surface of the substrate so that the first gas fills spaces between the one or more physical features formed on the substrate; and
depositing the first fluid onto the surface of the substrate subsequent to introducing the first gas into the environment of the surface of the substrate, wherein the first gas dissolves into the first fluid resulting in the first fluid filling the spaces between the one or more physical features formed on the substrate without gas remaining in the spaces between the one or more physical features formed on the substrate.

19. The method of claim 18, wherein the substrate processing unit is one of a coater-developer module configured for depositing films on surfaces of substrates, a cleaning module configured to clean the surface of the substrate, and a wet etch chamber configured to etch materials on the substrate using liquid etch chemicals.

20. A method comprising:
receiving a substrate in a substrate processing unit, the substrate processing unit configured to process semiconductor devices by depositing films on substrate surfaces, the substrate having one or more physical features formed on a surface of the substrate, the one or more physical features defining spaces between the one or more physical features;
introducing a solvent gas into an environment of the surface of the substrate, the solvent gas being dissolvable into a photoresist liquid;
depositing the photoresist liquid on the surface of the substrate subsequent to introducing the solvent gas into the environment of the surface of the substrate; and
spinning the photoresist liquid over the surface of the substrate, wherein the solvent gas facilitates distribution of the photoresist liquid into the spaces defined by the one or more physical features formed on the surface of the substrate by action of the solvent gas dissolving into the photoresist liquid.

* * * * *